United States Patent [19]
Veranth

[11] 3,953,806
[45] Apr. 27, 1976

[54] DISPLAYING AMPLIFIER OUTPUT AMPLITUDE

[75] Inventor: Joseph L. Veranth, Marlboro, Mass.

[73] Assignee: Bose Corporation, Framingham, Mass.

[22] Filed: Jan. 12, 1973

[21] Appl. No.: 322,923

[52] U.S. Cl................................. 330/2; 330/59; 340/332
[51] Int. Cl.².................................... H03F 17/00
[58] Field of Search ............... 330/2, 59; 307/311; 324/96; 340/332, 366 B, 366 D

[56] References Cited
UNITED STATES PATENTS

| | | | |
|---|---|---|---|
| 3,337,845 | 8/1967 | Hart | 340/332 X |
| 3,553,528 | 1/1971 | Somlyody | 340/332 X |
| 3,590,251 | 6/1971 | Vosteen | 330/59 X |
| 3,755,697 | 8/1973 | Miller | 307/311 |

FOREIGN PATENTS OR APPLICATIONS 236,883  8/1960  Australia................................ 330/2

Primary Examiner—James B. Mullins
Attorney, Agent, or Firm—Charles Hieken; Jerry Cohen

[57] ABSTRACT

A sequence of light emitting diodes are progressively illuminated with progressively increasing instantaneous amplifier output signal amplitude with the last pair of light emitting diodes illuminated simultaneously to indicate amplifier clipping.

5 Claims, 2 Drawing Figures

DISPLAYING AMPLIFIER OUTPUT AMPLITUDE

BACKGROUND OF THE INVENTION

The present invention relates in general to output level indicating and more particularly concerns novel apparatus and techniques for indicating the range embracing the instantaneous amplitude of an output signal level with reliable techniques that avoid delays inherent in mechanical indicating systems. Yet the apparatus is relatively inexpensive and reliable.

It is customary to use output VU meters to indicate the output signal level of an audio amplifier or tape recorder. A purpose of such indicators is to enable the user to adjust the amplification so as to avoid overload. That is to say, it is often desirable to set the amplification as high as possible consistent with avoiding overload upon occurrence of expected peak amplitudes. Thus, signals having the maximum expected peak amplitude are applied to the input and the amplifier gain adjusted so that the instantaneous maximum deflection of the meter does not exceed a predetermined value, such as zero dB on the meter scale. The difficulty with this approach is that the inertia of the meter movement is too great to respond to peak amplitudes that occur for a very short duration.

For further background reference is made to 51 Journal of the Acoustical Society of America 1777-80 (1972) published after the circuit of FIG. 2 was built, tested and found to work satisfactorily in achieving the objects set forth below.

Accordingly, it is an important object of this invention to provide methods and means for indicating the peak amplitude of an amplifier output signal.

It is another object of the invention to achieve the preceding object with an instantaneous peak that occurs for very short duration.

It is still a further object of the invention to achieve one or more of the preceding objects while providing a positive indication for amplifier overload.

It is a further object of the invention to achieve one or more of the preceding objects with a display of pleasing appearance.

It is a further object of the invention to achieve one or more of the preceding objects with apparatus that displays peak amplitudes in meaningful increments in a clear and unambiguous manner with reliable inexpensive apparatus.

SUMMARY OF THE INVENTION

According to the invention, a number of light emitting diodes (LED's) are connected in series with respective transistors each of which has a base coupled to a common input line by suitable attenuating means for progressively rendering respective LED's conductive as the amplitude on the input line progressively increases. The base-emitter portion of respective transistors functions as a half-wave rectifier and may be associated with an oppositely poled separate diode to prevent reverse emitter-base breakdown. A feature of the invention is that the last stage is referenced to the amplifier high voltage supply to indicate clipping and preferably includes a pair of LED's in series so that illumination of this last pair of diodes indicates clipping.

Numerous other features, objects and advantages of the invention will become apparent from the following specification when read in connection with the accompanying drawing in which:

DETAILED DESCRIPTION OF PREFERRED EMBODIMENTS

Figure 1:
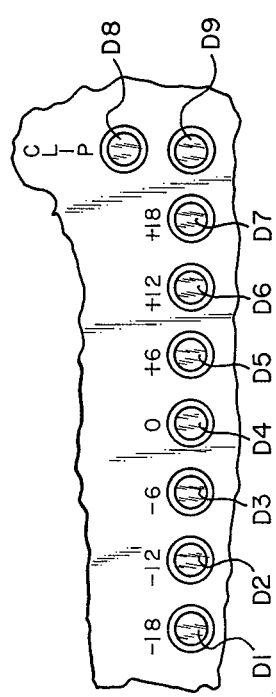
FIG. 1 is a pictorial representation of a typical display according to the invention.

With reference now to the drawing and more particularly FIG. 1 thereof, there is shown a pictorial representation of a typical panel display according to the invention in which light emitting diodes D1-D8 are progressively illuminated to indicate progressively higher peak signal amplitudes while diodes D8 and D9 are simultaneously illuminated to indicate clipping. A feature of the preferred form of the invention is that the amplitude increments between illumination of consecutive LED's is in equal dB increments to facilitate display of a wide dynamic range by sensing small as well as large signals without range switching. Furthermore, this logarithmic display more closely corresponds to subjective impressions of loudness than the linear scale that frequently characterizes a VU meter. In the specific example illustrated illumination of diodes D1-D3 indicates a reference level of zero dB relative to one watt into four ohms while illumination of progressively more or less LED's indicates level changes of six dB above and below zero reference level, respectively, to indicate peak levels over a dynamic range of 36 dB together with clipping.

Figure 2:
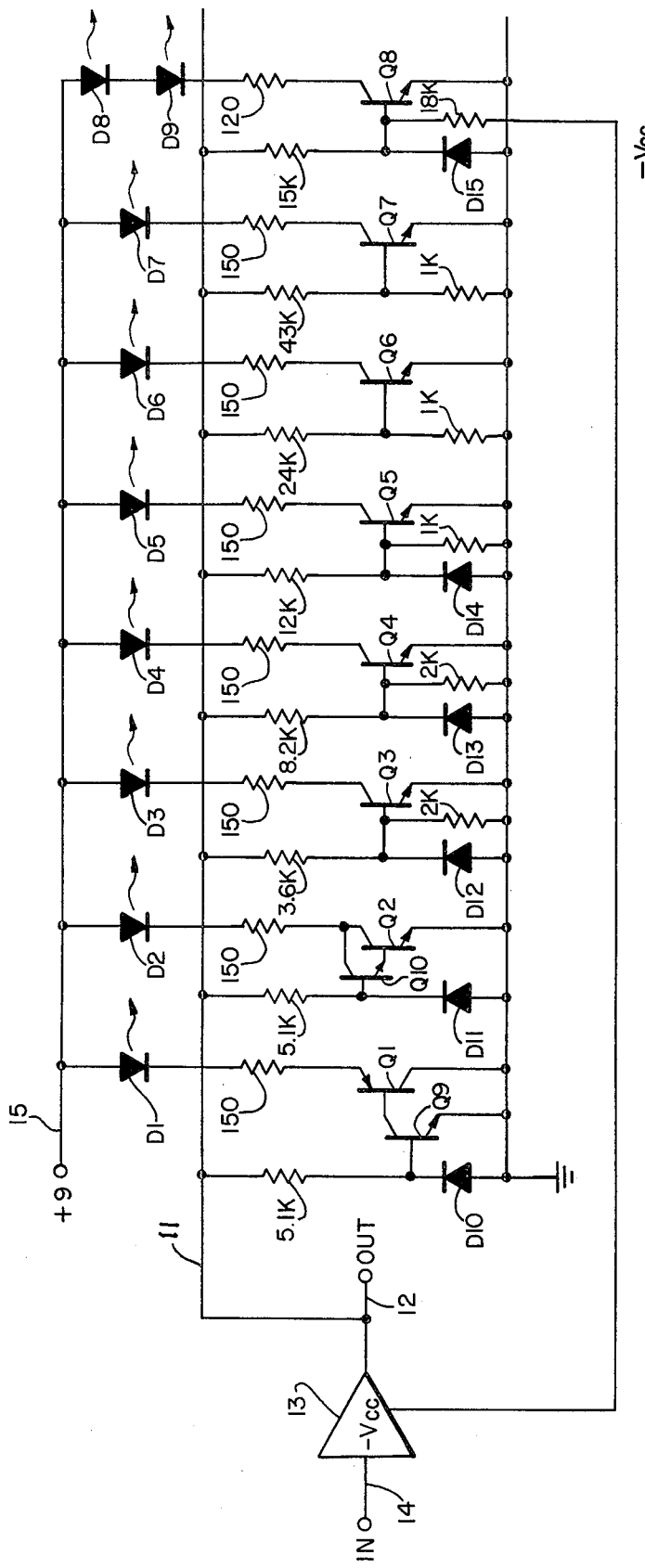
FIG. 2 is a combined block-schematic circuit diagram of an exemplary embodiment of the invention.

Referring now to FIG. 2, there is shown a schematic circuit diagram of a preferred embodiment of the invention with parameter values of an actual operative circuit indicated. The circuit comprises LED's D1-D9 and associated components with circuit input line 11 receiving the output signal on output terminal 12 of power amplifier 13 that receives an input signal to be amplified on input terminal 14. Each of the LED's D1-D7 conduct, and ignite, when associated transistors Q1-Q7, respectively, conduct. LED's D8 and D9 conduct when associated transistor Q8 conducts. Transistor Q8 conducts when the output signal on line 11 exceeds a predetermined level referenced to the amplifier d-c potential designated $V_{cc}$, typically a negative potential as indicated.

Each of NPN transistors Q2-Q7 includes a 150 ohm collector resistance in series with the associated one of LED's D2-D7. The emitter of each is grounded. The series collector resistance in transistor Q8 is 120 ohms because there are two LED's in series.

PNP transistor Q1 has a 150 ohm emitter resistor in series with LED D1, and its collector is grounded. The anodes of LED's D1-D8 are connected to the source of positive potential on line 15.

Each of transistors Q1-Q8 receives base control signals through appropriate coupling means from line 11 to conduct when the potential on line 11 reaches a predetermined peak level to be indicated by illumination of the associated LED.

Diodes D10-D15 are connected to the bases of transistors Q9, Q10, Q3, Q4, Q5 and Q8, respectively, to prevent reverse emitter-base breakdown of the associated transistor.

When the signal level on line 11 is sufficiently positive to render an associated base-emitter diode portion conductive, an associated one of transistors Q1-Q8 conducts to render associated ones of LED's D1-D9 conductive and illuminated. At the lowest level conduction of transistor Q9 causes transistor Q1 to conduct. Similarly at the next higher level conduction of transistor Q10 causes transistor Q2 to conduct.

Half-wave rectification as illustrated is preferred because full-wave rectification is more expensive and makes obtaining indication over a wide dynamic range more difficult because the minimum voltage that can be indicated is that across a pair of conducting diodes. The base-emitter portions of transistors effectively perform shunt rectification. The various resistors connected to line 11 are adjusted for equal increments in dB between ignition of consecutive lights, this increment being 6 dB for the example in FIG. 2 with the resistors having the indicated values.

When line 11 becomes slightly positive, NPN transistor Q9 conducts and thereby draws base current from the base of transistor Q1 to enable that transistor to conduct. As the potential on line 11 comes more positive, transistors Q10 and Q2 conduct to illuminate LED D2. This initial conduction occurs at a higher magnitude potential because the series combination of the base-emitter thresholds of transistors Q10 and Q2 in a Darlington circuit presents a higher threshold to the signal on line 11 than the single junction of Q9. At these low levels the use of two transistors provides the required high gain. By making transistor Q1 PNP in the circuit indicated, only one rectifying junction need be forward-biased to establish conduction at a very low signal amplitude on line 11.

The remaining voltage dividers from transistor Q3 to transistor Q7 comprise progressively larger series resistances connected to line 11 in series with resistances presented by one or more diode portions shunted by fixed resistances.

Transistor Q8 is biased beyond cutoff by the negative supply potential $V_{cc}$ in amplifier 13. When the positive output signal on line 11 becomes about 0.8 (15k/18k) the negative supply potential, a condition accompanied by clipping, transistor Q8 conducts to illuminate LED's D8 and D9 and thereby indicate clipping.

There has been described apparatus and techniques for indicating instantaneous signal levels in a fast and reliable manner. The equal dB increments facilitate indicating instantaneous output level over a large dynamic range sufficient to indicate both small and large instantaneous signal levels without range switching. Moreover, the logarithmic display approximates subjective impressions of audible loudness changes. The pair of LED's at the end of the display indicates actual overload conditions instantaneously.

In the specific embodiment of the invention illustrated LED's D1-D9 were type 4403 LED's. NPN transistors Q2-Q8, Q9 and Q10 were type 2N3904 transistors. NPN transistor Q1 was a type 2N3906 transistor. Diodes D10-D15 were type 1N4148 diodes.

The specific circuitry illustrated is by way of example for illustrating the best mode now contemplated for practicing the invention. It is evident that those skilled in the art may now make numerous uses and modifications of and departures from the specific embodiments described herein without departing from the inventive concepts. For example, the amplifier output could be full-wave rectified and then applied to line 11 to increase the illumination intensity of the LED's. Consequently, the invention is to be construed as embracing each and every novel feature and novel combination of features present in or possessed by the apparatus and techniques herein disclosed and limited solely by the spirit and scope of the appended claims.

What is claimed:

1. Apparatus for indicating the instantaneous amplitude range in which an output signal amplitude resides comprising,
   a plurality of light emitting diodes,
   a corresponding plurality of transistors in series with respective ones of said light emitting diodes,
   an input line for receiving a signal whose level is to be monitored,
   means for coupling the base of each transistor to said input line to progressively render conductive more of said transistors with increasing signal level amplitude on said input line,
   a power amplifier having its output connected to said input line and having a source of d-c potential of magnitude greater than the maximum amplitude on its output terminal except when clipping occurs,
   and means for biasing one of said transistor bases with said d-c potential so that the associated light emitting diode conducts only when the potential on the power amplifier output exceeds a predetermined fraction of said d-c potential.

2. Apparatus for indicating the range embracing an instantaneous maximum signal level amplitude in accordance with claim 1 and further comprising at least two of said light emitting diodes in series with the last-mentioned transistor.

3. Apparatus for indicating the instantaneous amplitude range in which an output signal amplitude resides comprising,
   a plurality of light emitting diodes,
   a corresponding plurality of transistors in series with respective ones of said light emitting diodes,
   an input line for receiving a signal whose level is to be monitored,
   means for coupling the base of each transistor to said input line to progressively render conductive more of said transistors with increasing signal level amplitude on said input line,
   a common terminal and a plurality of attenuating means connected between said input line and said common terminal with each attenuating means coupled to a respective one of said transistors with consecutive ones of said attenuating means coupling the signal on said input line to an associated one of said transistors with progressively greater attenuation so that the number of illuminated light emitting diodes is representative of said instantaneous signal level,
   wherein said attenuating means comprise means for establishing said progressively greater attenuation as a logarithmic function of the signal on said input line so that the difference between successive amplitudes just large enough to ignite adjacent light emitting diodes corresponds to substantially the same predetermined decibel difference.

4. Apparatus for indicating the range embracing an instantaneous signal level in accordance with claim 3 wherein said attenuating means are connected to the bases of respective transistors and further comprising,
   unilaterally conducting devices connected between at least some of said bases and said common terminal comprising means for preventing reverse emitter-base breakdown of the associated transistor.

5. Apparatus for indicating the range embracing an instantaneous signal level in accordance with claim 3 wherein the first of said attenuating means that imparts the greatest attenuation comprises resistive means intercoupling the base of an associated NPN transistor with said input line, the collector of said NPN transistor being connected to the base of a PNP transistor in series with an associated light emitting diode, the emitter of said NPN transistor and the collector of said PNP transistor being connected to said common terminal.

\* \* \* \* \*